United States Patent
Robinson et al.

(10) Patent No.: US 6,624,668 B1
(45) Date of Patent: Sep. 23, 2003

(54) DIGITALLY PROGRAMMABLE PHASE-LOCK LOOP FOR HIGH-SPEED DATA COMMUNICATIONS

(75) Inventors: Moises E. Robinson, Austin, TX (US); Michael J. Gaboury, Burnsville, MN (US); Bernard L. Grung, Eden Prairie, MN (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/005,736

(22) Filed: Nov. 6, 2001

Related U.S. Application Data (63) Continuation-in-part of application No. 09/708,695, filed on Nov. 8, 2000, now Pat. No. 6,462,594.
(60) Provisional application No. 60/246,668, filed on Nov. 8, 2000.

(51) Int. Cl.$^7$ .............................................. H02M 11/00
(52) U.S. Cl. ......................... 327/103; 327/66; 327/563
(58) Field of Search ............................. 327/103, 50–53, 327/63–66, 427, 519, 520, 538, 543, 560–563, 576, 581; 323/315; 330/252–255, 257, 261, 277, 278, 284, 288

(56) References Cited

U.S. PATENT DOCUMENTS

| | | | |
|---|---|---|---|
| 4,704,586 A | * 11/1987 | Wahl et al. ..................... 331/25 |
| 4,829,258 A | * 5/1989 | Volk et al. ..................... 327/156 |
| 5,369,376 A | * 11/1994 | Leblebicioglu ................ 331/8 |
| 5,373,537 A | 12/1994 | Oberhauser et al. |
| 5,386,437 A | 1/1995 | Yasuda |
| 5,404,250 A | 4/1995 | Hase et al. |
| 5,581,212 A | * 12/1996 | Huang et al. ................ 330/253 |
| 5,602,509 A | * 2/1997 | Kimura ....................... 330/253 |
| 5,757,238 A | 5/1998 | Ferraiolo et al. |
| 5,805,024 A | 9/1998 | Takashi et al. |
| 5,867,333 A | 2/1999 | Saiki et al. |
| 5,933,058 A | 8/1999 | Pinto et al. |
| 5,963,100 A | 10/1999 | Tolson et al. |
| 5,978,425 A | 11/1999 | Takla |
| 6,043,709 A | * 3/2000 | Shin ........................... 330/253 |
| 6,078,633 A | 6/2000 | Shiotsu et al. |
| 6,163,217 A | * 12/2000 | Matsubara et al. .......... 330/255 |
| 6,208,208 B1 | * 3/2001 | Komatsu et al. ............ 330/255 |
| 6,259,328 B1 | 7/2001 | Wesolowski |
| 6,462,594 B1 | * 10/2002 | Robinson et al. ........... 327/159 |

OTHER PUBLICATIONS

John G. Maneatis, "Low–Jitter Process Independent DLL and PLL Based on Self–Biased Techniques" IEEE Journal of Solid State Circuits, vol. 31, No. 11, Nov. 1996, pp. 1723–1732.

* cited by examiner

Primary Examiner—Timothy P. Callahan
Assistant Examiner—Hai L. Nguyen
(74) Attorney, Agent, or Firm—H. C. Chan

(57) ABSTRACT

Electronic devices are typically coupled together to operate as systems that require the communication of data between two or more devices. Many of these devices includes a communications circuit, such as receiver, transmitter, or transceiver for this purpose. A typical component in these communication circuits is the phase-lock loop, a circuit that in receiver circuits determines the timing of pulses in a received data signal and in transmitter circuits clocks the data out at a predetermined rate. One problem with phase-lock loops and thus the receiver and transmitter circuits that incorporate them is that they are generally tuned, or tailored, to operate at a certain frequency. This means that one cannot generally use a receiver or transmitter circuit having phase-lock loops tuned for one frequency to communicate at another frequency. The inability to communicate at other frequencies limits the usefulness of not only the receiver and transmitter circuits but also their electronic devices. Accordingly, the present inventors devised a digitally programmable phase-lock loop which operates at a frequency selected from a set of two of more frequencies. One such phase-lock loop includes a charge pump, a loop filter, and a voltage-controlled oscillator, all of which are programmable to control the operating frequency of the phase-lock loop and thus devices, such as receivers, transmitters, and transceivers incorporating it. Moreover, the programmability of these three components enables the exemplary embodiment to maintains a constant damping factor and a constant ratio of input frequency to loop bandwidth for each frequency setting, thereby promoting loop stability and rapid settling at each selected frequency.

18 Claims, 11 Drawing Sheets

DIGITALLY PROGRAMMABLE PHASE-LOCK LOOP FOR HIGH-SPEED DATA COMMUNICATIONS

This application is a continuation-in-part of application Ser. No. 09/708,695, filed on Nov. 8, 2000, now U.S. Pat. No. 6,462,594.

TECHNICAL FIELD

The present invention concerns data communications between electronic devices or circuits, particularly programmable phase-lock loops suitable for use in high-speed receivers, transmitters, and transceivers.

BACKGROUND

In the computer and telecommunications industries, many electronic devices are typically coupled together to operate as systems. For example, computers are often connected to printers, scanners, cameras, and even other computers. In such systems, a common occurrence is the communication of data between two devices, a sending device and a receiving device.

The sending device generally has the data in the initial form of a set of digital words (sets of ones and zeros). A circuit, known as a transmitter in the sending device, converts each word into a string or sequence of electrical pulses, with each pulse timed according to a data clock, and transmits the timed sequence of pulses through a cable or other connector to the receiving device. The receiving device includes a receiver circuit that first determines the timing of the pulses and then identifies each of the pulses in the signal as a one or zero, enabling it to reconstruct the original digital words.

A key component in both the transmitter and the receiver is the phase-lock loop. The phase-lock loop is a circuit that generates a high-speed clock for transmitting data in the transmitter, and that measures the timing of the pulses in a received data signal. In particular, the phase-lock loop compares the received data signal to an internally produced oscillating signal, and continuously adjusts the frequency of the oscillating signal to match or lock on that of the received data signal.

One problem with phase-lock loops and thus the transmitter and receiver circuits that incorporate them is that they are generally tuned, or tailored, to operate with data signals of a certain frequency. This means that one cannot generally use a transmitter or receiver circuit having a phase-lock loop tuned for data signals of one frequency with data signals of another signal. The inability to communicate at other frequencies limits the usefulness of the transmitter and receiver circuits and their electronic devices.

One approach to allow for an adjustable phase-lock loop is reported in John G. Maneatis, Low-Jitter Process Independent DLL and PLL based on Self-Biased Techniques, IEEE Journal of Solid-State Circuits, Vol. 31, No. 11(1996). However, the reported circuit appears to be vulnerable to stability problems at gigabit frequencies, which may prevent it from properly locking onto some input signals. Additionally, the circuit includes active resistor components, which the present inventors believe will be difficult to implement with low-voltage power supplies.

Accordingly, there is a need for better programmable phase-lock loops.

SUMMARY

To address these and other needs, the present inventors devised a digitally programmable phase-locked loop which operate at a frequency selected from a set of two or more frequencies.

An exemplary embodiment of the programmable phase-lock loop includes a phase-frequency detector, a charge pump, a loop filter, a voltage-controlled oscillator, and a frequency divider. The charge pump, loop filter, and oscillator are all responsive to a programmable input which selects the frequency of the phase-lock loop. Notably, the programmability of these three components enables the exemplary embodiment to maintain a constant damping factor and a constant ratio of input frequency to loop bandwidth for each frequency setting, thereby promoting stability and rapid settling at each frequency setting.

Other aspects of the invention include a receiver, transmitter, and transceiver that incorporate a digitally programmable phase-lock loop. One exemplary receiver includes a phase-lock loop with four programmable components: a charge pump, a loop filter, a controlled oscillator, and a transconductor.

DETAILED DESCRIPTION OF EXEMPLARY EMBODIMENTS

The following detailed description, which references and incorporates the above-identified figures, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known to those of skill in the art.

Figure 1:
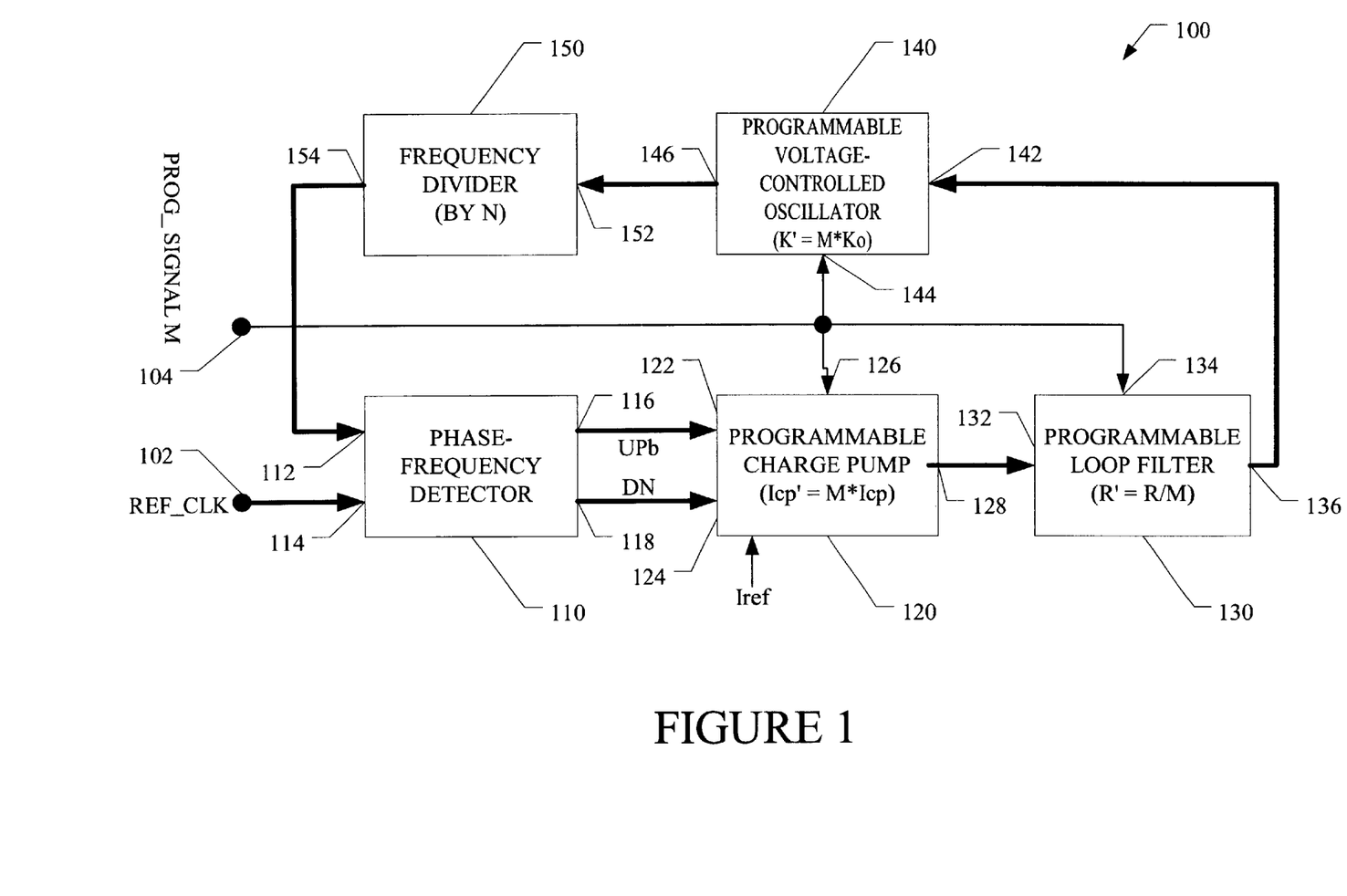
FIG. 1 is a block diagram of an exemplary digitally programmable phase-lock loop 100 incorporating teachings of the invention and including a programmable charge pump, a programmable loop filter, and a programmable voltage-controlled oscillator.

FIG. 1 shows an exemplary digital programmable phase-lock loop 100 incorporating teachings of the present invention. In particular, phase-lock loop 100 includes a phase-frequency detector 110, a programmable charge pump 120, a programmable loop filter 130, a programmable voltage-controlled oscillator 140, and a frequency divider 150.

Additionally, phase-lock loop 100 includes a reference-clock input node 102 for a reference clock signal and a programmable input 104 for program signal M, a two-bit word in the exemplary embodiment.

Phase-frequency detector 110 includes inputs 112 and 114 and outputs 116 and 118. Input 114 is connected to reference-clock input node 102 and input 112 connected to an output 154 of frequency divider 150. Outputs 116 and 118 of the phase-frequency detector are connected respectively to inputs 122 and 124 of programmable charge pump 120.

Programmable charge pump 120, which is also connected to program signal M via a program input 126, has an output 128. Output 128 produces an output current $I_{cp}$ based on program signal M, a reference current $I_{ref}$, and signals received at its inputs 122 and 124. In the exemplary embodiment, output current $I_{cp}$ is effectively a scaled version of the reference current $I_{ref}$, with the scaling selected from a set of predetermined options using the program signal M. Output 128 is connected to input 132 of programmable loop filter 130.

Figure 3:
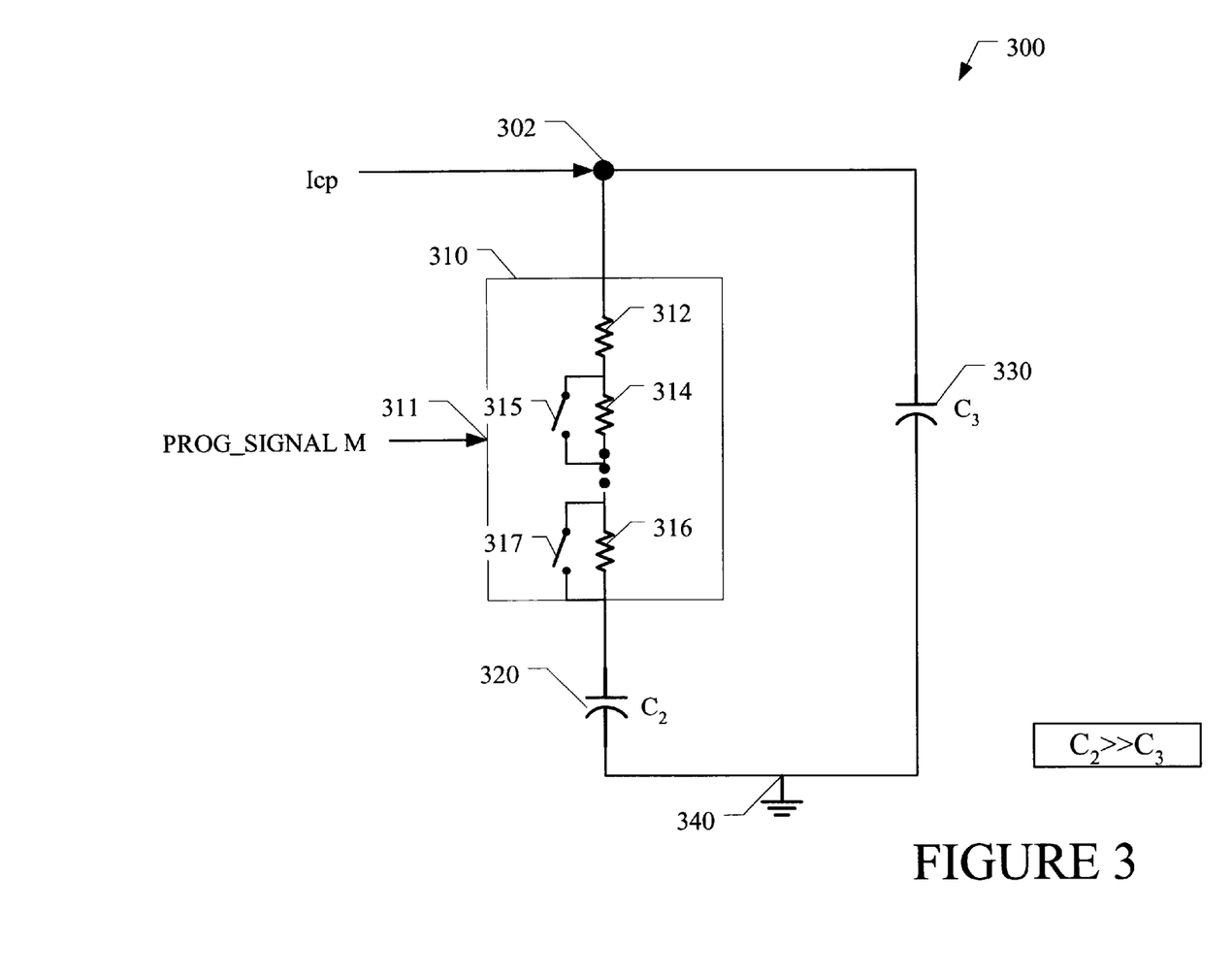
FIG. 3 is a schematic diagram of an exemplary programmable loop filter 300 for use in the phase-lock loop of FIG. 1.

Programmable loop filter 130, which receives program signal M at a program input 134, includes an output node 136. Filter 130 has a discretely programmable characteristic frequency response. The exemplary embodiment achieves this programmability using a programmable filter resistance R and a substantially constant filter capacitance, with resistance R' directly proportional to a substantially constant resistance R and inversely proportional to the numerical equivalent of program signal M. (FIG. 3 shows details of one exemplary implementation.) However, the invention is not limited to any particular function of program signal M. Additionally, other embodiments of the invention could implement the programmable loop filter with a programmable capacitor and fixed resistor or with a programmable capacitor and a programmable resistor. Output node 136 is coupled to input 142 of programmable voltage-controlled oscillator 140.

Figure 4:
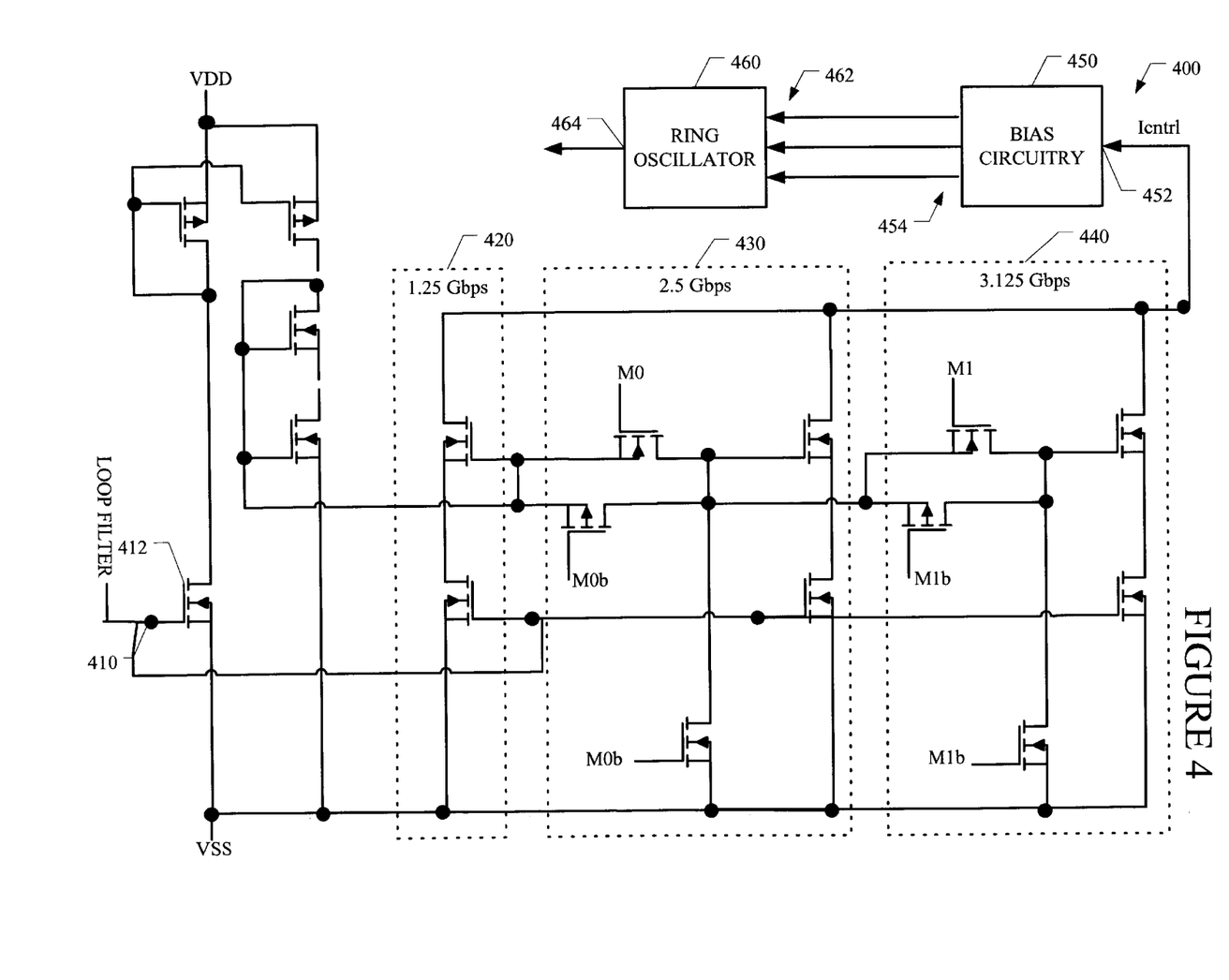
FIG. 4 is a diagram of an exemplary programmable voltage-controlled oscillator for use in the phase-lock loop of FIG. 1.

Oscillator 140 additionally includes a program input 144 and an output 146. Program input 144 is connected to receive program signal M, and output 146 provides an oscillating signal of substantially constant amplitude and variable frequency. The variable frequency is a function of the loop filter output magnitude and an oscillator gain $K_o$, which itself is a function of program signal M. In the exemplary embodiment, oscillator gain $K_o$ is a function of a base oscillator gain K and one of a set of predetermined scalings, with the selected scaling based on the program signal M. (FIG. 4 shows details on one exemplary voltage-controlled oscillator suitable for use within loop 100.) Output 146 is connected to input 152 of frequency divider 150.

Frequency divider 150 divides the frequency of signals at its inputs by a constant factor N. The resulting signal of reduced frequency is communicated through output 154 to input 112 of phase-frequency detector 110. N is a factor of two in the exemplary embodiment. Although not shown as programmable in this exemplary embodiment, other embodiments of the invention could make the factor N a function of the program signal M, with an appropriately adjustable or programmable reference clock.

Operation of the exemplary PLL is characterized by the loop bandwidth $\omega^*_N$ and damping factor $\xi^*$. For a loop having the topology of the exemplary embodiment, the loop bandwidth and damping factor are respectively defined as $$\omega^*_N = \sqrt{\frac{I_{cp} * K_o}{N * C_2}} \qquad (1)$$

$$\xi^* = \omega^*_N * \frac{R * C_2}{2} \qquad (2)$$

where $I_{cp}$ is the magnitude of the charge-pump output current; $K_o$ is the gain of the voltage-controlled oscillator, N is the divisor for the frequency divider, R is the resistance in the loop filter, and $C_2$ is the capacitance in series with the loop resistance R. These equations assume that $C_2$ is much larger than $C_3$, a capacitance coupled across the series connection of resistance R and capacitance $C_2$. An exemplary design goal is provide a capacitance $C_2$ which is more than ten times greater than capacitance $C_3$.

These general expressions can be readily modified to account for the specific programmability of the exemplary embodiment. In particular, the exemplary embodiment scales both the charge-pump output current $I_{cp}$ and the gain of the voltage-controlled by the program signal M. Thus, equation (1) can be rewritten to express the loop bandwidth of the exemplary embodiment as $$\omega_N = \sqrt{\frac{(M * I_{cp}) * (M * K_o)}{N * C_2}} \qquad (3)$$

Recognizing the M*M term under the radical in equation (3) and using the definition for loop bandwidth in equation (1) allows one to rewrite equation (3) as $$\omega_N = M * \sqrt{\frac{I_{cp} * K_o}{N * C_2}} = M * \omega^*_N \qquad (4)$$

Equation (4) shows that the exemplary embodiment allows one to scale the loop bandwidth using program signal M.

Similarly, the generic damping factor can be written to show the programmability of the exemplary embodiment by replacing loop bandwidth $\omega^*_N$ with $\omega_N$ and the loop resistor R with R', their programmable counter parts. This yields $$\xi = \omega_N * \frac{R' * C_2}{2} \qquad (5)$$

where $\omega_N$ is defined in equation (4) and R' is defined as R/M. Making these substitutions into equation (5) yield equation (6):

$$\xi = M * \omega^*_N * \frac{R * C_2}{2 * M} = \omega^*_N * \frac{R * C_2}{2} = \xi^* \qquad (6)$$

This equation reveals that the damping factor is constant for the range of programming frequencies. Thus, one can fix the damping factor at a constant value, such as 0.707, and have it remain fixed despite changes in the loop bandwidth.

The exemplary phase-lock loop is also characterized by a constant ratio of the reference clock frequency to the loop bandwidth. In other words, $$\frac{f_{ref-clk}}{f_N^*} = constant, \quad where \ f_N^* = \frac{\omega_N^*}{2\pi} \qquad (7)$$

This constant ratio follows from recognizing that the reference frequency in the exemplary embodiment is changed to track the desired changes in the loop bandwidth. Thus, changing the loop bandwidth by a factor of M is accompanied by a commensurate change in reference frequency. Equation (8) shows this as $$\frac{M * f_{ref-clk}}{M * f_N^*} = \frac{f_{ref-clk}}{f_N^*} \qquad (8)$$

In general, operating phased-lock loop 100 entails first establishing or selecting its operating frequency using program signal M and providing a desired reference clock. In the exemplary embodiment, program signal M is a 2-bit word. Table 1 below lists the reference clock and operating frequency associated with some allowable values of program signal M.

TABLE 1

| M[1:0] | Ref_Clk | Operating Frequency |
| --- | --- | --- |
| 00 | 62.5 MHZ | 1.25 Gb/s |
| 01 | 125 MHZ | 2.50 Gb/s |
| 10 | 156.25 MHZ | 3.125 Gb/s |

Other embodiments of the invention use smaller or larger program signals to define the phase-lock loop to operate at higher frequencies and/or with greater frequency granularity in the operating frequency.

Figure 2:
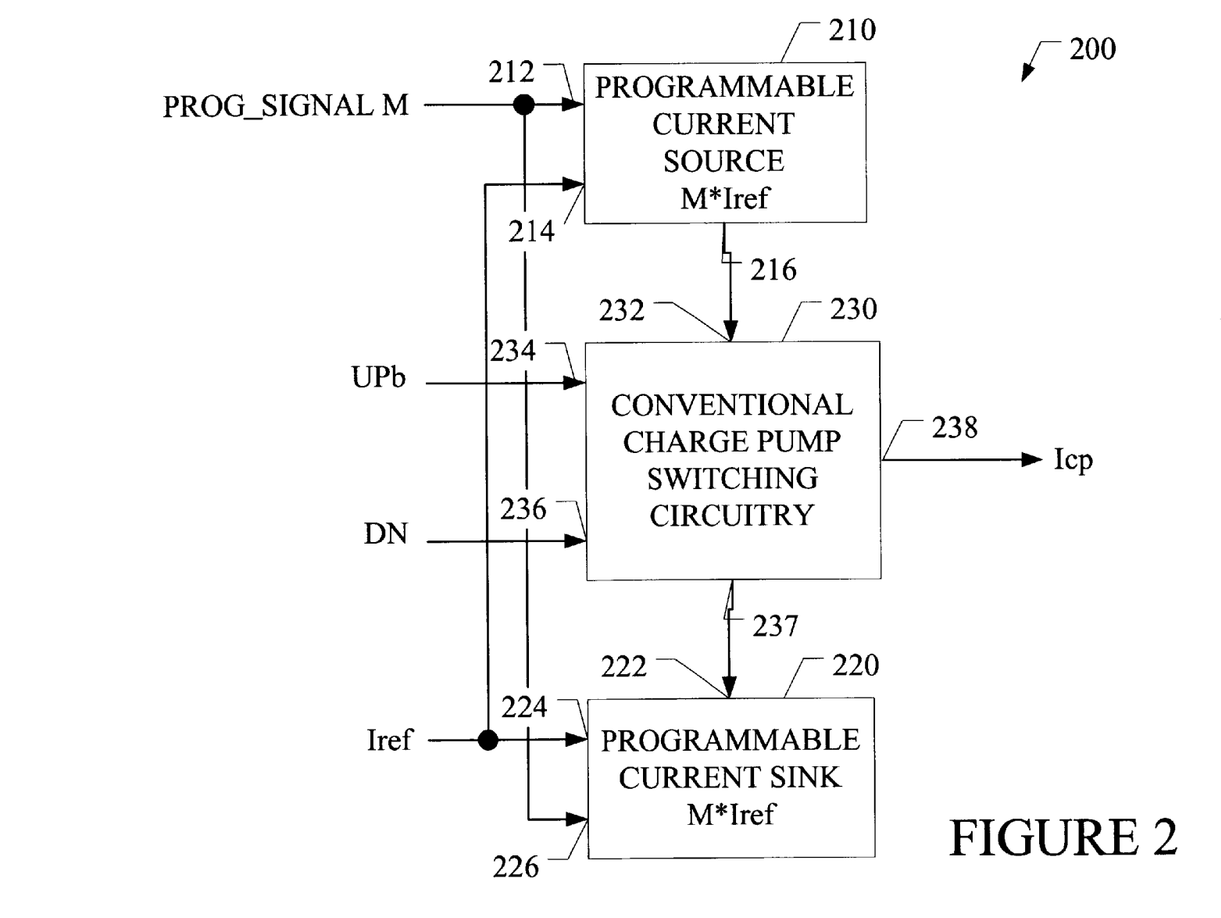
FIG. 2 is a schematic diagram of an exemplary programmable charge pump 200 for use in the phase-lock loop of FIG. 1.

FIGS. 2–4 respectively show an exemplary programmable charge pump, an exemplary programmable loop filter, and an exemplary programmable voltage-controlled oscillator, all for use in exemplary phase-lock loop 100. These components accept an exemplary two-bit program signal M[1:0], specifically comprising an M[0] bit and an M[1] bit. Table 2 below shows the bit values for programming these components to one of three different loop bandwidths:

TABLE 2

| M[0] | M[1] | Operating Frequency |
| --- | --- | --- |
| 0 | 0 | 1.25 Gb/s |
| 0 | 1 | 2.50 Gb/s |
| 1 | 1 | 3.125 Gb/s |

In particular, FIG. 2 shows an exemplary CMOS (complementary metal-oxide-semiconductor) programmable charge pump 200 for use as charge pump 120 in the exemplary programmable loop filter. Programmable charge pump 200 includes a programmable current source 210, a programmable current sink 220, and conventional charge-pump circuitry 230. Programmable current source 210 has inputs 212 and 214 coupled respectively to receive program signal M and reference current Iref. Likewise, programmable current sink 220 has inputs 226 and 224 coupled respectively to receive program signal M and reference current Iref. The programmable current sources and sinks provide currents of similar magnitude based on the program signal M and reference current Iref.

In the exemplary embodiment, reference current Iref is about 150 microamps. Additionally, the exemplary embodiment implements the programmable current source and current sink as a current mirror with switched output stages, with each output stage sized to provide a specific amount of current. Thus, to implement the three speeds (data-communication rates) of 1.25, 2.5, and 3.125 Gb/s, the exemplary embodiment provides three output stages, with one output stage always connected, and the other two selectively coupled with switches to change the output current. For the 1.25 Gb/s mode, only one of the output stages is on; for the 2.5 Gb/s mode, two of the stages are on; and for the 3.125 Gb/s mode, all of the stages are on, with activation of each stage increasing the amount of current. (Other embodiments can program the charge pump current by using the program signal to control the magnitude of the reference current Iref, for example, by selecting from one or more preset reference currents using a multiplexer or controlling a single current source or sink. Still other embodiments select from one or more separate current mirrors. Thus, the present invention is not limited to any particular programming technique.) The switches are controlled using M[0], M[1], and their respective complements, thereby enabling control over the amount of current available to flow into and out of charge pump circuitry 230.

Charge pump circuitry 230 includes inputs 232, 234, and 236, and outputs 237, and 238.

Respective inputs 232, 234, 236, and 237 are coupled to programmable current source 210, UPb output signal from a phase-frequency detector, the DN signal from the phase-frequency detector, and current sink 220. Though not shown because of its conventional nature, circuitry 230 includes a conventional complementary pair of n- and p-type transistors which are controlled by the UP and DN phase-frequency-detector output signals (or their complements), selectively coupling source 210 and sink 220 to output 238. Output 238, which provides the charge-pump output current Icp, is coupled to a programmable loop filter.

FIG. 3 shows an exemplary programmable loop filter 300 for use as loop filter 130 in the exemplary phase-lock loop. Loop filter 300 includes filter node 302, a programmable resistance 310, capacitors 320 and 330, and a ground reference node 340. Programmable resistor 310, which is connected between filter node 302 and capacitor 320, includes an input 311 coupled to receive program signal M, and a number of component resistors, of which resistors 312, 314, and 316 are representative. Component resistors 312, 314, and 316 have respective exemplary values of 590, 325, and 975 Ohms. Respective switches 315 and 317, which are implemented as transmission gates in the exemplary embodiment, are coupled in parallel with resistors 314 and 316, and are controlled by program signal M. In the exemplary embodiment, the M[1] bit of program signal M controls switch 315, and the M[0] bit controls switch 317. The values of the M[1] and M[0] bits in the program signal. M switch respective component resistors 314 and 316 out of series with component resistor 312, establishing the resistance value of programmable resistor 310. (Some embodiments of the invention use an additive rather than subtractive technique to control the resistance.)

Coupled between resistor 310 and ground reference node 340 is capacitor 320. In the exemplary embodiment, capacitor 320 is composed of the gate capacitances of six MOSFETs (metal-oxide-semiconductor-field-effect transistors). Each of the gate capacitances has a capacitance of 16.67 picofarads, providing a total capacitance of about 100 picofarads.

Capacitor 330 is coupled between filter node 302 and ground reference node 340. In the exemplary embodiment, capacitor 330 is composed of the gate capacitance of a single MOSFET and provides a capacitance of about 1.25 picofarads. Some embodiments could control the characteristic response of loop filter by altering the capacitance alone or in combination with the resistance of the loop filter. Other embodiments may use digital filters. Thus, the present invention is not limited to any particular programming technique.

FIG. 4 shows an exemplary programmable voltage-controlled oscillator 400 for use as oscillator 140 in the exemplary phase-lock loop. In addition to program signal bits (inputs) M[ 1:0], and their respective complements, oscillator 400 includes loop-filter control input 410, input MOSFET 412, a 1.25 Gb/s current-sink stage 420, a 2.5 Gb/s current-sink stage 430, a 3.125 Gb/s current-mirror stage 440, bias circuitry 450, and a ring oscillator 460.

In 1.25 Gb/s mode as determined by the program inputs, stages 430 and 440 are turned off, leaving MOSFET 412 to control the current through current-sink stage 420. Loop filter output voltages at control input 410 thus result in a predetermined control current Icntrl drawn from an input node 452 of bias circuitry 450. In response, bias circuitry produces a set of output signals 454, which in the exemplary embodiment, includes a Pbias signal; an Nbias signal, and an Nbiasc signal. These signals, coupled to corresponding inputs 462 of ring oscillator 460, govern the gain and frequency of the ring oscillator. Ring oscillator produce corresponding oscillating signals at output 464.

In 2.5 Gb/s mode, stages 420 and 430 are turned on and stage 440 is turned off, leaving current-sink stages 420 and 430 to both draw current from node 452 and thus increasing the gain of the oscillator beyond that provided with stage 420 alone. Similarly, in 3.125 Gb/s mode, stages 420, 430, and 440 are turned on, further increasing the gain of the oscillator. Thus, the exemplary embodiment uses an additive technique to build the current controlling the gain of the oscillator.

Other embodiments of the invention implement the programmable oscillator use other techniques. For example, some embodiments simply switch on or off specific current sinks (or other circuits) to set the control current to the appropriate level, or select the desired current from a set of predetermined current sources or sinks, with the selected current independent of the value of the other currents. Other embodiments may switch on or off specific current mirrors or portions of current mirrors to develop appropriate control currents. Still other embodiments may control the oscillator gain using voltage-based techniques. Thus, the invention is not limited to any particular method of programming the oscillator gain.

Exemplary Receiver Incorporating Programmable Phase-Lock Loop

Figure 5:
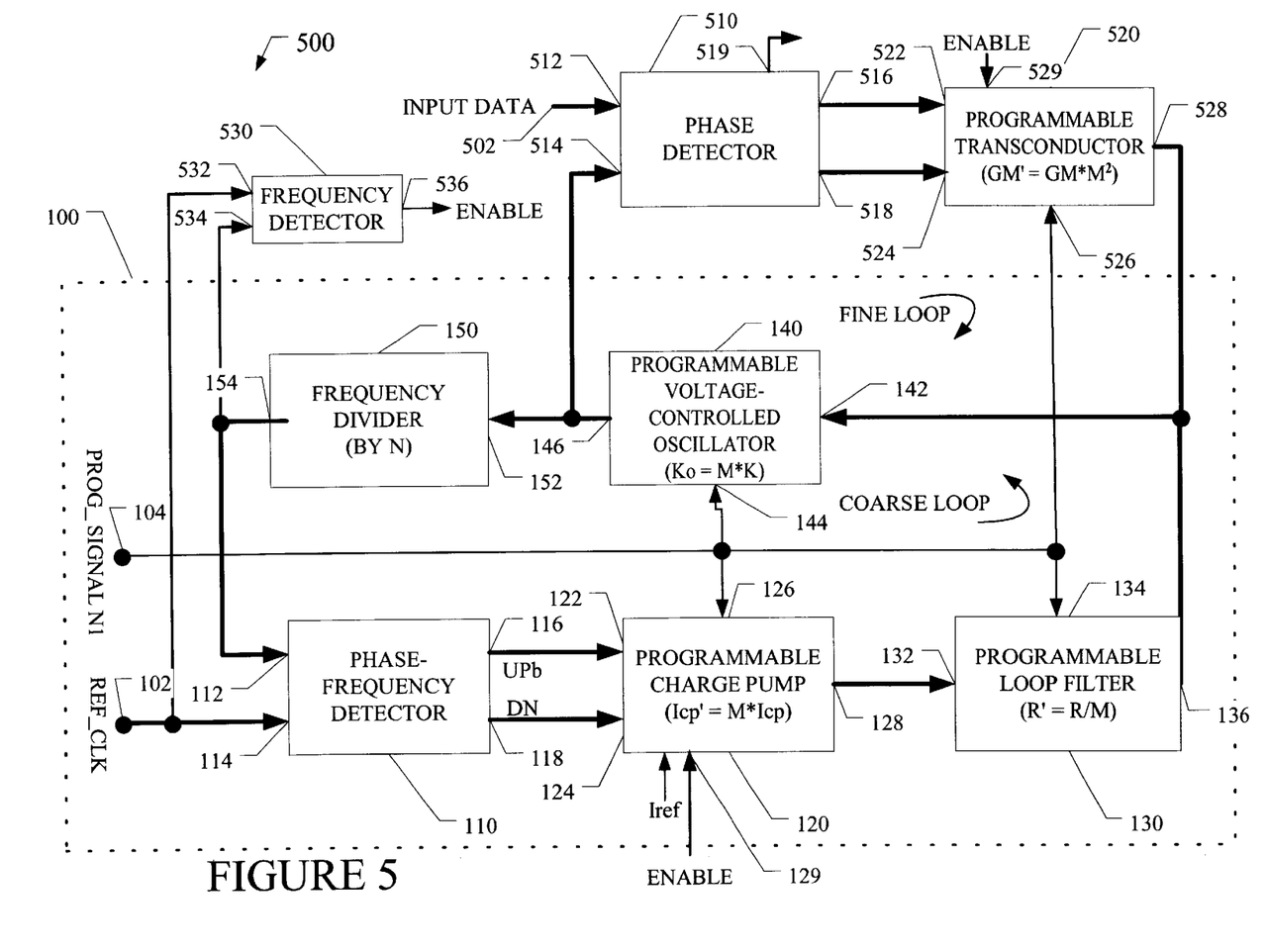
FIG. 5 is a block diagram of an exemplary receiver 500 incorporating phase-lock loop 100.

FIG. 5 shows an exemplary receiver 500 which incorporates the exemplary phase-lock loop 100 of FIG. 1 along with a phase detector 510, a programmable transconductor 520, and a frequency detector 530.

Phase-lock loop 100 includes a phase-frequency detector 110, a programmable charge pump 120, a programmable loop filter 130, a programmable voltage-controlled oscillator 140, and a frequency divider 150. Additionally, phase-lock loop 100 includes a reference-clock input node 102 for a reference clock signal and a program input 104 for program signal M, a 2-bit word in the exemplary embodiment.

Phase detector 510 includes inputs 512 and 514 and outputs 516, 518, and 519. Input 512 is connected to data input 512, and input 514 is connected to twenty multi-phase clock outputs 146 of programmable voltage-controlled oscillator 140. In the exemplary embodiment, the phase detector oversamples the input data by a factor of two and provides five parallel data outputs at one-tenth the input data rate. More particularly, the input data lines comprise complementary data lines, and ten high-speed capture latches (not shown) are used to convert the serial input data into parallel data paths. That is, the input data is sampled twice per data bit. One sample is in the middle of the data period, and the other sample is at the edge of the data period. The edge sample is used to adjust the phase of the phase-lock loop. The middle sample is used as one of the five parallel data outputs.

The five middle samples are also used in a logic function to determine the validity of the edge samples. When two adjacent middle samples have the same value, then the intervening edge sample is invalid and is rejected. When two adjacent middle samples differ in value, the magnitude of the intervening edge sample is valid and the sign of the value needs to be determined. A positive sign is used for a positive transition, and a negative sign is used for a negative transition. When valid, the resulting edge sample is proportional to the phase error.

When the input data is provided at, for example, 1.25 Gb/s, each path operates with a 0.125 GHz clock. The phase detector, therefore, produces a complementary pair of analog voltages at outputs 516 and 518, which have a differential voltage proportional to the phase error between the input data and the oscillator frequency. Outputs 516 and 518 of phase detector 510 are connected respectively to inputs 522 and 524 of programmable transconductor 520. Output 519 provides output data to other circuitry (not shown) that aligns and decodes the received data.

Programmable transconductor 520, which is connected to program signal M via program input 526, has an output 528. Output 528 produces an output current Igm based on program signal M, the transconductance of the transconductor, and signals received at its inputs 522 and 524. In the exemplary embodiment, the transconductance is selectable from a set of predetermined options using the program signal M. Output 128 is connected to input 132 of programmable loop filter 130.

Figure 6A:
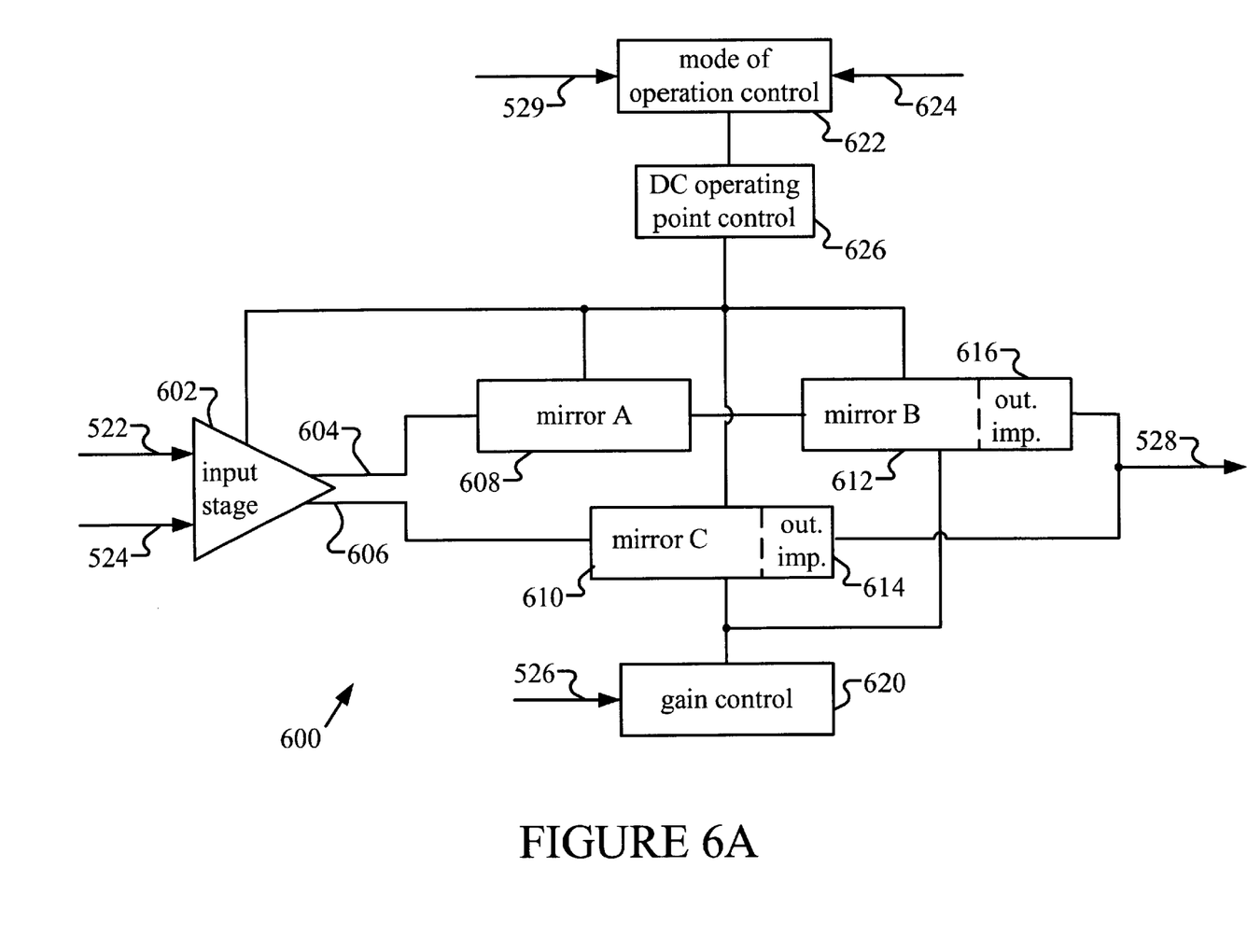
FIG. 6A is a block diagram of an exemplary programmable transconductor for use in the receiver of FIG. 5.
Figure 6B:
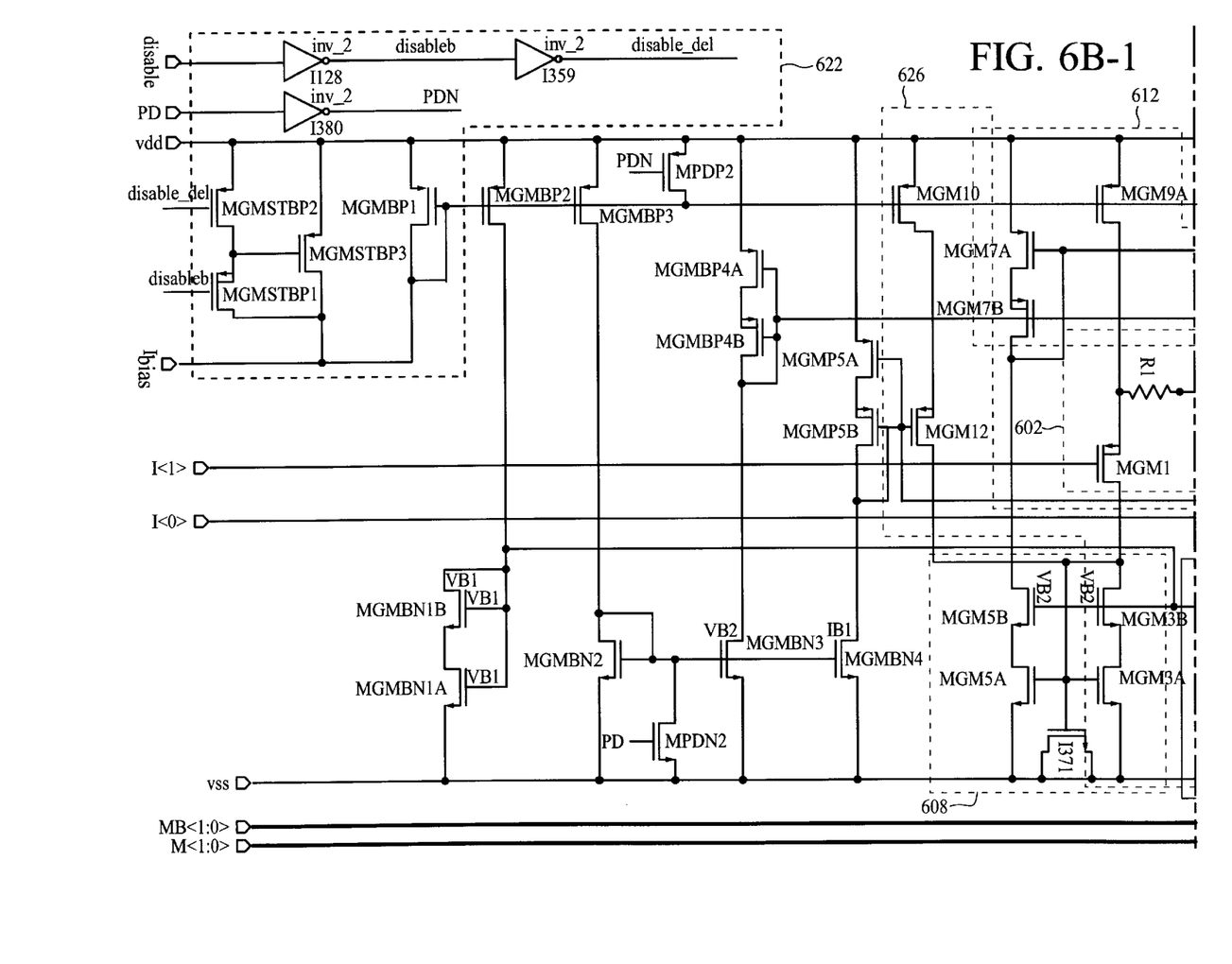
FIG. 6B is a schematic diagram of an exemplary programmable transconductor for use in the receiver of FIG. 5.
Figures 6B, 6B, 6B:
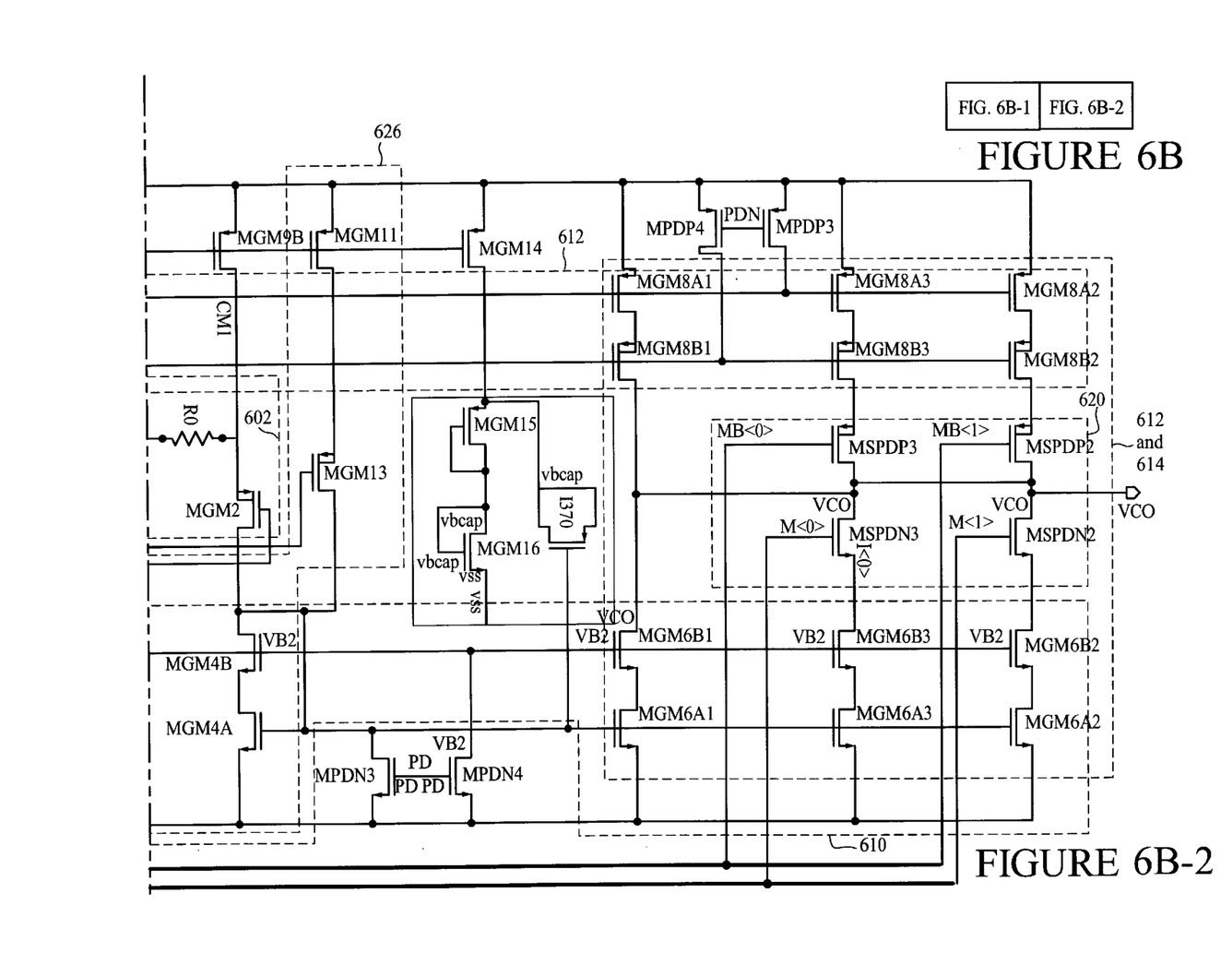

FIG. 6A shows a block diagram of an exemplary programmable transconductor 600 that can be used as programmable transconductor 520. As is well known in the art, a transconductor is a device that converts a voltage into a current, and the conversion factor is called the transconductance (or Gm) of the device. FIG. 6B shows an exemplary implementation 640 of programmable transconductor 600. Elements that are common in FIGS. 5, 6A and 6B have the same reference numerals.

Transconductor 600 comprises an input stage 602 that accepts two voltages (at inputs 522 and 524) and generates two currents (at lines 604 and 606). The first current at line 604 is delivered to a first current mirror 608 and the second current at line 606 is delivered to a second current mirror 610. The output of first current mirror 608 is sent to another current mirror 612. In order to provide a large output impedance to voltage controlled oscillator 140 of FIG. 5, the output stages of current mirrors 610 and 612 contain output impedance circuits 614 and 616, respectively.

Programmable transconductor 600 contains a gain control 620. It accepts a programming signal at input 526, and applies control signals to current mirrors 610 and 612. Programmable transconductor 600 also contains a mode of operation control 622. It accepts at least one mode control signal at input 529 (but may have other inputs to accept other control signals, such as input 624). Mode of operation control 622 is coupled to a DC operating point control 626 that controls the DC operating points of input stage 602 and mirrors 608, 610 and 612.

Transconductor 640 of FIG. 6B is an exemplary design that can be used for Gigabit-speed applications. In this embodiment of the present invention, the value of Gm is very small when compared to the inherent transistors' transconductances. As a result, the implementation of transconductor 640 uses several special techniques to generate the effective/low value of Gm.

Input stage 602 of FIG. 6A comprises two p-channel MOSFETs (MGM1 and MGM2 of FIG. 6B) that have their gates coupled to the differential input signals (shown as I<0> and I<1> in FIG. 6B, which correspond to the signals at inputs 522 and 524 of FIG. 6A). The input stage produces a differential current through transistor MGM1 and transistor MGM2 based on the differential input voltage. P-channel input devices are preferably used (as opposed to n-channel input devices) to lower noise because flicker noise is less on p-channel transistors.

Input stage 602 of FIG. 6A also comprises two degeneration resistors R0 and R1 (shown in FIG. 6B). These resistors are used to reduce the Gm value of the input stage (and thus of the overall transconductor). Resistors R0 and R1 also help to increase the linear range of operation for the input voltage.

Finally, symmetrical layout techniques are preferably used on the input stage in order to minimize any DC offsets on the circuit due to device mismatches.

Current through transistor MGM1 is mirrored first through current mirror 608, which comprises n-channel MOSFETs MGM3A, MGM3B, MGM5A and MGM5B, followed by current mirror 612, comprising p-channel MOSFETs MGM7A, MGM7B, MGM8A1 and MGM8B1. In high-speed mode, switch transistor MSPDP2 is turned ON, adding additional MOSFET's MGM8A2, and MGM8B2 to current mirror 612. MOSFETs MGM8A2 and MGM8B2 are sized to increase the current mirrored to the output node by the square of the increase in data rate. Thus, if the data rate is doubled from, e.g., 1.25 Gb/s to 2.5 Gb/s, transistors MGM8A2 and MGM8B2 are sized such that, in combination with transistors MGM8A1 and MGM8B1, current mirror 612 produces a current that is four times greater than that previously produced by transistors MGM8A1 and MGM8B1. Also, current mirror 612 can be further augmented with transistors MGM8A3 and MGM8B3 through activation of switch device MSPDP3 to further increase the current at the output node. This allows for a third frequency option of, for example, 3.125 Gb/s. Switches MSPDP2, MSPDP3, MSPDN2 and MSPDN3 are switched on or off according to the state of program signal M<y:0> and its complement MB<y:0>. Program signals M and MB correspond to the signal on input 526 of FIG. 6A.

It should be noted that the program signal could contain many bits, each can be used to control a different set of transistors in the current mirrors. As a result, the present invention provides a method for digitally selecting many levels of Gm values.

Similarly, current through transistor MGM2 is mirrored through current mirror 610 to the output node. Mirror 610 comprises n-channel MOSFETs MGM4A, MGM4B, MGM6A1, and MGM6B1. In other speed modes, additional MOSFETs MGM6A2, MGM6B2, MGM6A3 and MGM6B3 are selectively added to current mirror 610 according to the state of program signals M and MB.

It is well known that an ideal transconductor has infinite output impedance. In FIG. 6B, transistors MGM8A1, MGM8A2, MGM8A3, MGM8B1, MGM8B2, MGM8B3, MGM6A1, MGM6A2, MGM6A3, MGM6B1, MGM6B2 and MGM6B3 the output branches of cascode current mirrors 610 and 612, and they provide a large output impedance for the transconductor. The output of transconductor 640 is shown as "VCO" in FIG. 6B, which corresponds to output 528 of FIG. 6A.

For DC stability the mirror gains preferably obeys $G_A^* G_B = G_C$ (where G represents the gain of the corresponding current mirror). It should be noted that in one embodiment, current mirrors 608, 610 and 612 provide current attenuation, as opposed to current gain, for the situation (like the present design) that prefers a very low value of Gm.

There are reasons why designers prefer the ability to change the Gm value of the transconductor (especially in some types of circuits such as PLLs and clock recovery circuits). Some of the reasons are: (a) different Gm values allow the PLL or clock recovery circuit to have better operation across different data rates (as described above when discussing the current mirrors); (b) different Gm values help compensate the PLL loop dynamics/stability when input signals can have varying amplitudes and/or varying slew rates, and (c) different Gm values help compensate for process, temperature and power supply variations that affect the loop response of the PLL or clock recovery circuit.

In the embodiment of FIG. 6B, there are three different modes of operation: power down, normal/active, and standby.

In response to an input signal PD, transconductor 640 can be powered down. This is achieved by activating transistors MPDN2, MPDN3, MPDN4, MPDP2, MPDP3, MPDP4 and inverter I380.

In response to a "disable" signal (which is the inverse of the ENABLE signal at input 529), transistors MGMSTBP1, MGMSTBP2 and MGMSTBP3 switch transconductor 640 from the normal/active mode of operation to the standby mode of operation. During normal/active mode of operation, all of the biasing input current ($I_{bias}$) flows through the diode-connected device MGMBP1. This current is used to generate all the proper DC operating points for the whole transconductor. On the standby mode of operation, transistor MGMSTP3 is placed in parallel with device MGMBP1, basically reducing the amount of DC current that flows through MGMBP1. This action has the net effect of "weakening" the DC biasing points of the transconductor, thus placing the transconductor in a "weak" or "standby" mode of operation. Since the transconductor is not completely OFF (powered down), the "turn-ON" or "settling" time for the transconductor is much smaller when going from "standby" to "normal" mode, than if we went from "power down" to "normal" mode. The faster settling is crucial, in achieving proper stability and loop dynamics on clock recovery circuits.

Finally the following transistors are used to properly bias transconductor 640 for normal/active mode of operation: MGMBP1, MGMBP2, MGMBP3, MGM9A, MGM9B, MGMBN1A, MGMBN1B, MGMBN2, MGMBN3, MGMBP4A, MGMBP4B.

Auxiliary bias currents generated by devices MGM10, MGM11, MGM12, MGM13, MGMBN4, MGMP5A and MGMP5B of transconductor 640 are used to provide extra biasing current for most of the transconductor circuit (except the input stage). This allows transconductor 640 to have a low Gm value in the input devices (due to the low current levels through the input devices), while still able to provide reliable current mirror operation through current mirrors 608, 610 and 612 (because these current mirrors have larger biasing currents, thus keeping all transistors in saturation).

In the present embodiment, all the cascode devices (indicated in FIG. 6B by transistors MGMxBy, where x and y are integers) provide power supply and common mode rejection. Common mode rejection beyond the use of the differential pair formed by devices MGM1 and MGM2 is enhanced by the addition of transistors I370 and I371 to transconductor 640. In addition, transistors MGM14, MGM15 and MGM16 are also added to isolate transistor I370 from the power supply noise so as not to reduce power supply rejection while increasing the common mode rejection.

Frequency detector 530 has inputs 532 and 534 and an output 536. Inputs 532 and 534 are coupled respectively to reference-clock input 102 and frequency-divider output 154. Output 536, denoted ENABLE, is coupled to enable input 129 of programmable charge pump 120 and to enable input 529 of programmable transconductor 520. Frequency detector 530 determines whether output of the frequency divider at output 154 is close enough in frequency to the reference clock input REF_CLK, de-asserting the enable signal at output 536 to disable programmable charge pump 120 and to enable operation of programmable transconductor 520. In the exemplary embodiment, frequency detector 530 de-asserts the enable signal when the frequency divider output has a frequency within two percent of the reference-clock frequency.

Figure 7:
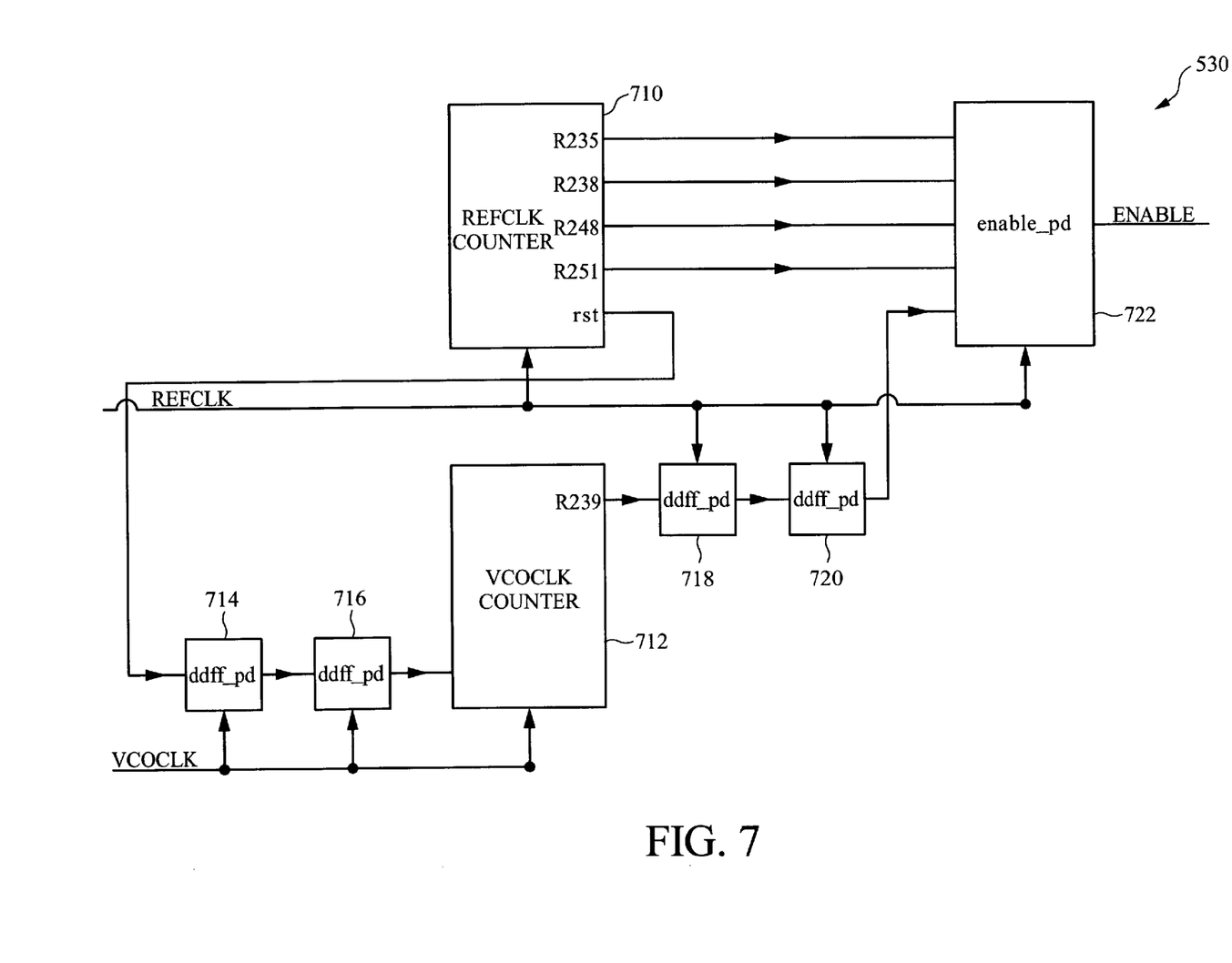
FIG. 7 is a schematic diagram of an exemplary frequency detector for use in the receiver of FIG. 5.

FIG. 7 shows an exemplary embodiment of frequency detector 530 including eight-bit counters 710 and 712, dynamic D-type flip-flops 714, 716, 718, and 720, and an enable block 722. In operation, counters 710 and 720 count respectively the transitions in the reference clock and the transitions in the output of the frequency divider. Enable block 720 monitors the difference between the two counts, outputting a logic low ENABLE signal when the difference is less than 2.0 percent and a logic high ENABLE signal when the difference is greater than 3.5 percent. If the difference is between 2.0 and 3.5 percent, the ENABLE signal remains in its previous state, meaning that the frequency detector exhibits hysteresis. This property is provided to ensure stability of the ENABLE signal. Other implementations could use different hysteresis points.

Thus, FIG. 5 shows that the exemplary receiver includes two phase-lock loops: a coarse loop that locks to the reference-clock input, and a fine loop that locks to the input data, with the coarse loop switch off and the fine loop switched on when the frequency of the frequency-divider output is deemed closed enough to that of the reference clock. Both loops share oscillator 140, and both loops are programmable for different operating frequencies.

From the equations governing programming of the coarse loop (that is, equations 1–8), it is known that increasing the operating frequency of the loop by a factor of M while maintaining constant damping and loop bandwidth entails changing both the oscillator gain Ko and the loop-filter resistance by a factor of M, specifically increasing the oscillator gain Ko and decreasing the loop-filter resistance. Mathematically expressing the new oscillator gain K' and loop-filter resistance R' in terms of the old and the factor M yields $$K^1 = M * K_o \quad (9)$$

$$R' = \frac{R}{M} \quad (10)$$

In general, the natural frequency, or loop bandwidth, $\omega_N$ of the fine loop can be approximated as $$\omega_N \approx \sqrt{\frac{K_o * SR * GM * 8}{2\pi * bit\ rate * C_2}} \quad (11)$$

where SR is the slew rate of the input signal, Ko is the voltage-controlled oscillator gain, GM is the transconductance, and bit_rate is (that is, number of bits per second) of the input data signal.

Increasing the oscillator gain and the bit rate by the factor M and assuming the slew rate SR remains constant yields the following new loop bandwidth $\omega'_N$:

$$\omega'_N \approx \sqrt{\frac{M * K_o * SR * GM' * 8}{M * bit\ rate}} \quad (12)$$

where GM' denotes the transconductance associated with the new bandwidth and where M in the numerator and denominator cancel. Setting equation (12) equal to $M*\omega'_N$ and solving for GM' gives $$GM^1 \approx M^2 * GM \quad (13)$$

Thus, to program receiver 500 for a factor M increase in operating frequency while also maintaining a constant damping factor and constant input-frequency-to-natural-loop-frequency ratio entails: reducing the loop resistance by the factor M; increasing oscillator gain and charge-pump current output by the factor M; and increasing transconductance by the square of the factor M.

Exemplary Transmitter Incorporating Programmable Phase-Lock Loop

Figure 8:
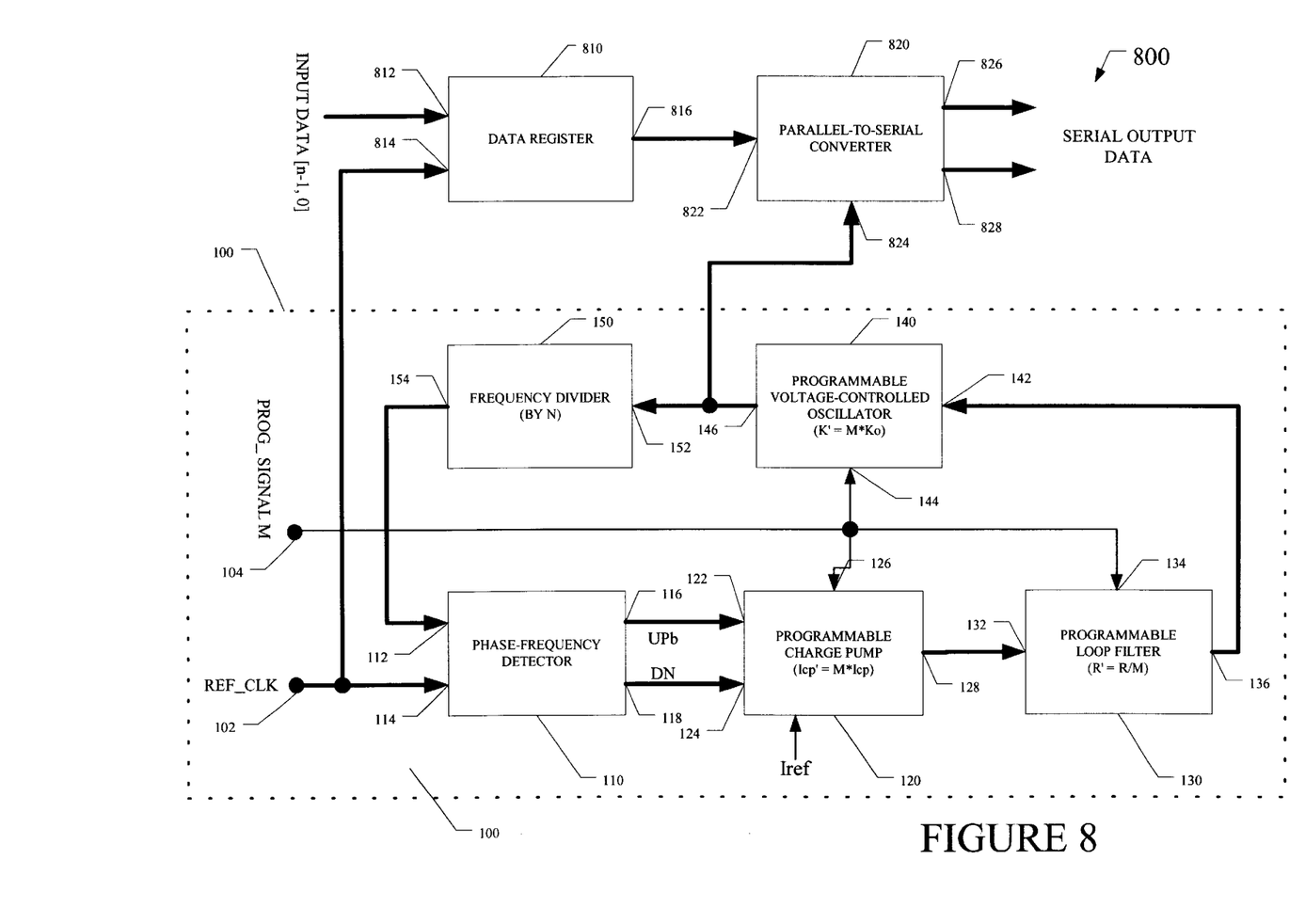
FIG. 8 is a block diagram of an exemplary transmitter 800 incorporating the exemplary phase-lock loop of FIG. 1.

FIG. 8 shows an exemplary transmitter 800 which incorporates the exemplary phase-lock loop 100 of FIG. 1 along with a data register 810 and a parallel-to-serial converter 820.

Within transmitter 800, phase-lock loop 100 functions as a programmable clock multiplier, with the output of voltage-controlled oscillator 140 clocking data out of parallel-to-serial converter 820.

More particularly, data register 810 includes a number n data inputs 812 for registering and/or buffering one or more n-bit data words. Parallel-to-serial converter 820, coupled to data register 810 via inputs 822, converts n-bit data words received from register 810 to single-ended or differential serial data. Converter 820 has an input 824 which is coupled to voltage-controlled oscillator 140, and outputs 826 and 828 which output differential serial data.

Exemplary Devices and System Incorporating Programmable Phase-Lock Loops

Figure 9:
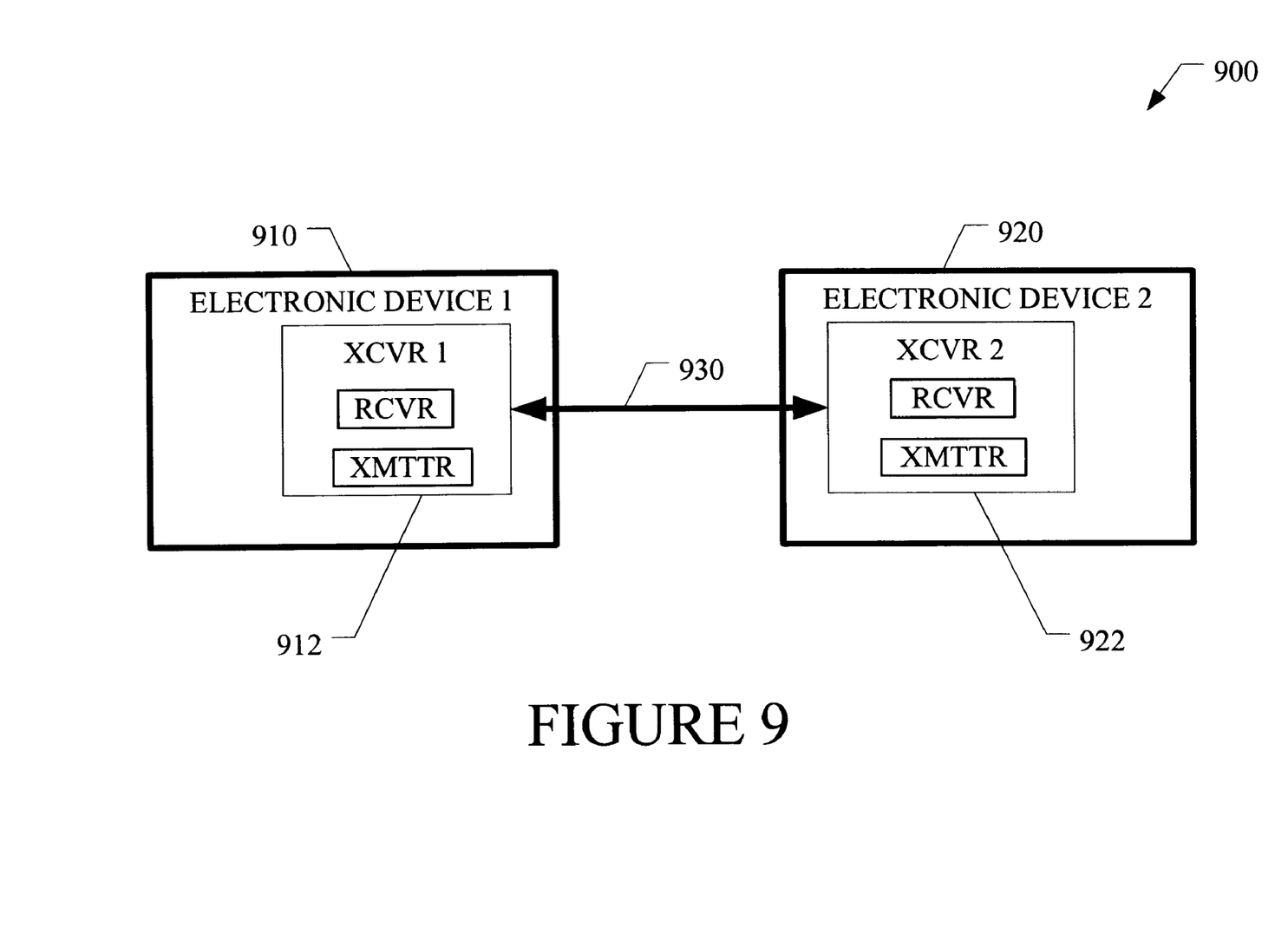
FIG. 9 is a block diagram of an exemplary system 900 incorporating the exemplary receiver and transmitter of respective FIGS. 5 and 8.

FIG. 9 shows an exemplary system 900 incorporating teachings of the present invention. In particular, system 900 includes electronic devices 910 and 920 and a communication link 930. Devices 910 and 920 include respective integrated transceiver circuits 912 and 922, each of which includes one or more exemplary programmable receivers 500 and one or more exemplary programmable transmitters 800. (In some embodiments, the receiver and transmitter share circuitry with appropriate switching, circuitry coordinating their operation.) Communication link 930, which lacks a data-synchronizing clock line in the exemplary embodiment, carries data between the devices 910 and 920 at data rates of 1.25, 2.5, or 3.125 Gb/s. However, other embodiments implement other sets of discrete programmable operating frequencies, with higher or lower frequencies and/or lesser or greater numbers of frequencies.

CONCLUSION

In furtherance of the art, the present inventors have presented new digitally programmable phase-lock loops, related methods, and applications. An exemplary phase-lock loop includes three programmable components: a charge pump, loop-filter, and oscillator. Notably, the programmability of these three components enables the exemplary embodiment to maintain a constant damping factor and a constant ratio of input frequency to loop bandwidth for each frequency setting. Applications for this phase-lock loop include receivers, transmitters, and transceivers and promise to enable flexible high-speed communications at a number of selectable frequencies.

The embodiments described above are intended only to illustrate and teach one or more ways of practicing or implementing the present invention, not to restrict its breadth or scope. The actual scope of the invention, which embraces all ways of practicing or implementing the teachings of the invention, is defined only by the following claims and their equivalents.

What is claimed is:

1. A transconductor that generates an output current as a function of a first and a second input voltage, comprising:
   an input stage that accepts said first and said second input voltages and generates a first and a second current;
   a first current mirror having an input terminal and an output terminal, said input terminal accepting said first current;
   a second current mirror having an input terminal coupled to said output terminal of said first current mirror and further having an output terminal;
   a third current mirror having an input terminal and an output terminal, said input terminal accepting said second current;
   a control circuit for controlling mode of operation of said input stage, said first current mirror, said second current mirror, and said third current mirror;
   a programmable gain control circuit that controls gains of said second and said third current mirrors;
   wherein said output terminals of said second and said third current mirrors are coupled to generate said output current.

2. The transconductor of claim 1 wherein each of said second and said third current mirrors comprises a circuit for increasing output impedance.

3. The transconductor of claim 1 wherein said mode of operation comprises a standby mode and a normal mode.

4. The transconductor of claim 3 further comprising a circuit for generating DC operating point of said input stage, said first current mirror, said second current mirror, and said third current mirror, wherein said control circuit causes said DC operating point to be at a first point when said mode of operation is at said normal mode and at a second point when said mode of operation is at said standby mode.

5. The transconductor of claim 4 wherein said control circuit controls biasing current that generates said DC operating point.

6. The transconductor of claim 1 wherein said mode of operation comprises a power down mode.

7. The transconductor of claim 1 further comprising a circuit to reduce power supply noise.

8. The transconductor of claim 1 further comprising a circuit to reduce common mode noise.

9. The transconductor of claim 1 wherein said input stage has a first transconductance value, wherein said transconductor has a second transconductance value, and wherein said first transconductance value is larger than said second transconductance value.

10. The transconductor of claim 1 herein each of said second and said third current mirrors contains at least a first and a second current path, and said gain control circuit turning said second current path on or off in response to a program signal.

11. The transconductor of claim 1 wherein said gain control circuit comprises at least one switching transistor.

12. The transconductor of claim 1 herein said gains of said second and said third current mirrors are less than one.

13. The transconductor of claim 1 wherein product of gain of said first and said second current mirrors is substantially same as gain of said third current mirror.

14. A programmable phase-locked loop, comprising:
   a first loop; and
   a second loop coupled to the first loop comprising a programmable transconductor that generates an output current as a function of a first and a second input voltage, wherein the transconductor comprises:
      an input stage that accepts said first and said second input voltages and generates a first and a second current;
      a first current mirror having an input terminal and an output terminal, said input terminal accepting said first current;
      a second current mirror having an input terminal coupled to said output terminal of said first current mirror and further having an output terminal;
      a third current mirror having an input terminal and an output terminal, said input terminal accepting said second current;
      a control circuit for controlling mode of operation of said input stage, said first current mirror, said second current mirror, and said third current mirror; and
      a programmable gain control circuit that controls gains of said second and said third current mirrors;
   wherein said output terminals of said second and said third current mirrors are coupled to generate said output current.

15. The programmable phase-locked loop of claim 14, wherein the second loop further comprises a phase detector, coupled to the programmable transconductor, wherein the programmable transconductor is further coupled to a programmable voltage-controlled oscillator.

16. The programmable phase-locked loop of claim 15, wherein the first loop comprises the programmable voltage-controlled oscillator, a programmable charge pump, and a programmable loop filter.

17. The programmable phase-locked loop of claim 16, wherein the first loop further comprises a frequency divider and a phase-frequency detector coupled between the programmable voltage-controlled oscillator and the programmable charge pump.

18. The programmable phase-locked loop of claim 16, wherein the programmable voltage-controlled oscillator, the programmable charge pump, the programmable loop filter and the programmable transconductor are controlled by a single program signal.

* * * * *